US008796664B2

(12) United States Patent
Duan et al.

(10) Patent No.: US 8,796,664 B2
(45) Date of Patent: Aug. 5, 2014

(54) GRAPHENE-BASED COMPOSITE STRUCTURE AND METHOD FOR MAKING THE SAME

(71) Applicants: Wen-Hui Duan, Beijing (CN); Yuan-Chang Li, Beijing (CN); Peng-Cheng Chen, Beijing (CN); Jian Wu, Beijing (CN); Bing-Lin Gu, Beijing (CN)

(72) Inventors: Wen-Hui Duan, Beijing (CN); Yuan-Chang Li, Beijing (CN); Peng-Cheng Chen, Beijing (CN); Jian Wu, Beijing (CN); Bing-Lin Gu, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/685,654

(22) Filed: Nov. 26, 2012

(65) Prior Publication Data

US 2014/0110662 A1    Apr. 24, 2014

(30) Foreign Application Priority Data

Oct. 22, 2012   (CN) .......................... 2012 1 0403400

(51) Int. Cl.
*H01L 29/06*   (2006.01)
*C01B 31/04*   (2006.01)

(52) U.S. Cl.
USPC ............... 257/9; 257/613; 977/734; 423/448

(58) Field of Classification Search
None
See application file for complete search history.

(56) References Cited

U.S. PATENT DOCUMENTS

2010/0255984 A1*  10/2010  Sutter et al. .................... 502/185
2011/0031104 A1*  2/2011   Barker et al. ............... 204/157.2
2012/0141799 A1*  6/2012   Kub et al. ...................... 428/408

OTHER PUBLICATIONS

Gao et al., Atomic-Scale Morphology and Electronic Structure of Manganese Atomic Layers Underneath Epitaxial Graphene on SiC(0001), ACS Nano, 2012, 6(8), pp. 6562-6568, Aug. 3, 2012.*

* cited by examiner

*Primary Examiner* — Andres Munoz
(74) *Attorney, Agent, or Firm* — Novak Druce Connolly Bove + Quigg LLP

(57) ABSTRACT

A graphene-based composite structure is disclosed. The graphene-based composite structure includes a graphene layer, a transition metal layer, and a substrate. The graphene layer, transition metal layer, and substrate are stacked together in series to form a sandwich structure. The graphene layer and the transition metal layer are coupled by d-p orbitals hybridization. The transition metal layer and the substrate are also coupled by d-p orbitals hybridization. A method for making graphene-based composite structure is also disclosed.

18 Claims, 5 Drawing Sheets

GRAPHENE-BASED COMPOSITE STRUCTURE AND METHOD FOR MAKING THE SAME

CROSS-REFERENCE TO RELATED APPLICATIONS

This application claims all benefits accruing under 35 U.S.C. §119 from China Patent Application No. 201210403400.8, filed on Oct. 22, 2012 in the China Intellectual Property Office, disclosure of which is incorporated herein by reference.

BACKGROUND

1. Technical Field

The present disclosure relates to graphene-based composite structures and method for making the graphene-based composite structures.

2. Description of Related Art

Graphene, a one-atom-thick carbon sheet, has peculiar band structure and other outstanding physical properties, which makes graphene an appealing material for both fundamental studies and modern technological applications. Due to the two-dimensional nature of graphene, however, a substrate is required for most practical applications.

Silicon carbide (SiC) substrate is a commonly used substrates compatible with graphene. The graphene/SiC composite structure is considered as a strongly-bound system due to the formation of C—Si bonds between the carbon lattice and SiC substrate. However, the C—Si bonds leads to a heightened corrugation of the graphene, which makes the graphene lose its Dirac cone.

Some related art has tried to recover the Dirac cone of the graphene by decoupling strong interaction between the carbon lattice and SiC substrate. Saturated modification of the surface of the SiC substrate through light elements (such as hydrogen, helium and lithium) doping is one effective way. These kinds of doped graphene/SiC composite structures can preserve the Dirac cone of graphene, which means excellent electronic properties. However, the graphene and SiC substrate are combined via van der Waals force therebetween in these kinds of doped graphene/SiC composite structures. Thus, the thermal and mechanical stabilities of the composite structures are relatively low and the vast applications of the composite structures are highly restricted.

What is needed, therefore, is to provide a graphene-based composite structure and a method for making the same. The graphene-based composite structure preserves Dirac cone structure whilst exhibits strong interaction between the graphene and substrate.

BRIEF DESCRIPTION OF THE DRAWINGS

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
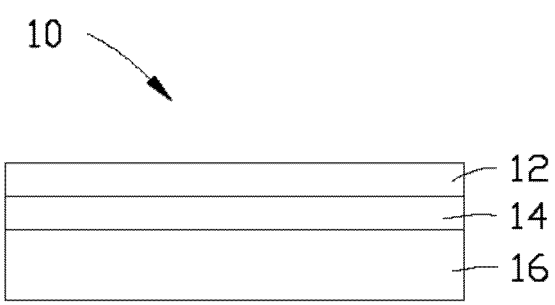
FIG. 1 is a schematic drawing of the graphene-based composite structure according to one embodiment.

Referring to FIG. 1, a graphene-based composite structure 10 of one embodiment includes a graphene layer 12, a transition metal layer 14, and a substrate 16. The graphene layer 12, transition metal layer 14, and substrate 16 are stacked together in series. The transition metal layer 14 is located between the graphene layer 12 and the substrate 16 and contacts surfaces of the graphene layer 12 and the substrate 16.

In one embodiment, the graphene-based composite structure 10 consists of the graphene layer 12, the transition metal layer 14, and the substrate 16, which avoids introducing interference factor to affect band structure and atomic structure of the graphene-based composite structure 10.

The graphene layer 12 is a single-layer graphene according to one embodiment, which has a substantially smooth surface. The single-layer graphene is a bulk carbon lattice, which has relatively high and stable carrier mobility. The shape and area of the graphene layer 12 is not restricted. In one embodiment, the shape and area of the graphene layer 12 is equal to the shape and area of the substrate 16.

The transition metal layer 14 is a one-atom-thick transition metal layer according to one embodiment. The transition metal can be scandium (Sc), titanium (Ti), vanadium (V), chromium (Cr), manganese (Mn), iron (Fe), cobalt (Co), nickel (Ni), technetium (Tc) or rhenium (Re). In one embodiment, the transition metal is Mn. In another embodiment, the transition metal is Re. The transition metal layer 14 is a continuous and smooth layer according to one embodiment, which assures a strong coupling with the graphene layer 12 as well as the substrate 16. The shape and area of the transition metal layer 14 is equal to the shape and area of the substrate 16 according to one embodiment.

The substrate 16 is a semiconductor plate. In one embodiment, the substrate 16 is a SiC substrate. In detail, an n-doped 6H—SiC(0001) is used in the SiC substrate. In another embodiment, the substrate 16 is a silicon substrate. The thickness of the substrate 16 is not restricted and can be selected to suit for various practical applications.

Figure 2:
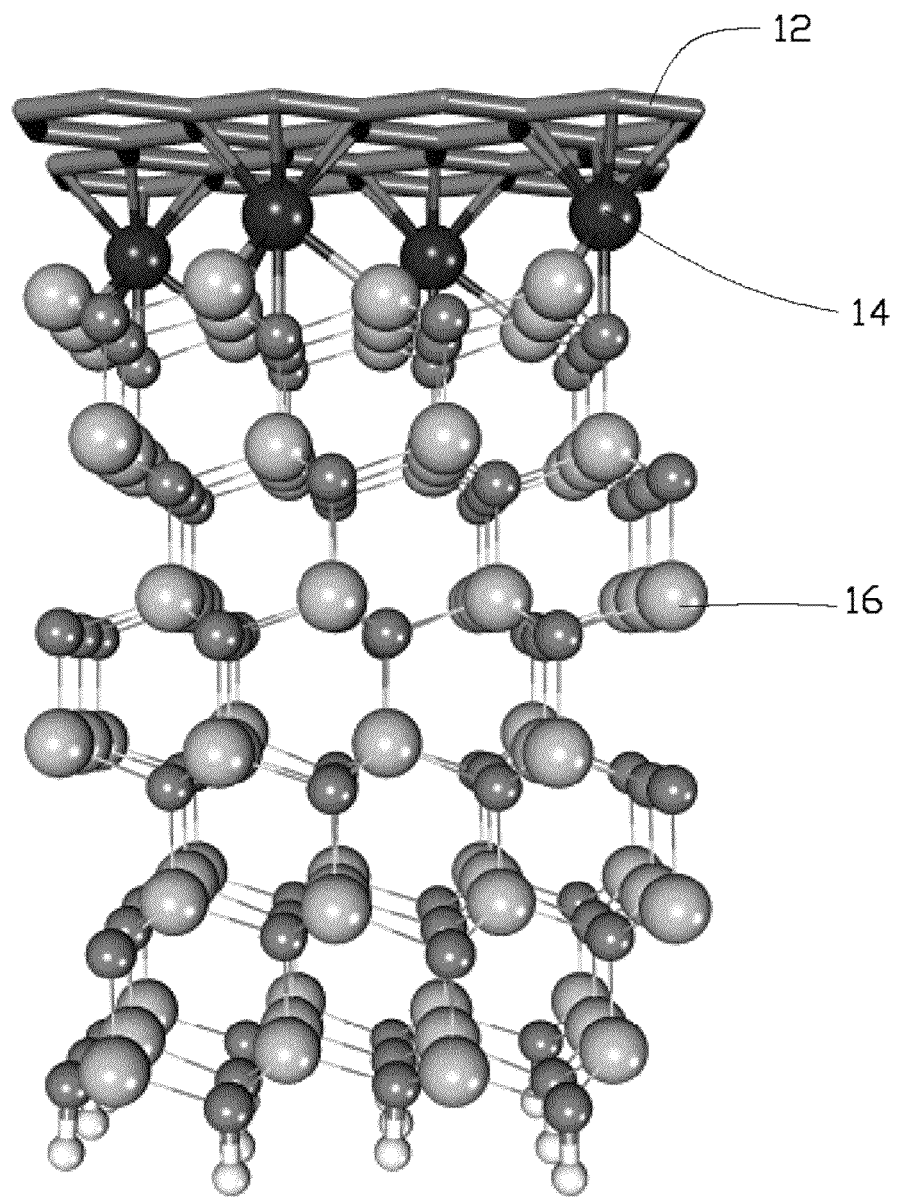
FIG. 2 is a schematic drawing of atomic structure of the graphene-based composite structure according to one embodiment.

Referring to FIG. 2, the graphene layer 12 and the transition metal layer 14 are coupled by d-p orbitals hybridization. In detail, the d orbitals of at least part of the transition metal atoms in the transition metal layer 14 are hybridized with the p orbitals of part of the carbon atoms in the graphene layer 12. The transition metal layer 14 and the substrate 16 are also coupled by d-p orbitals hybridization. In detail, the d orbitals of at least part of the transition metal atoms in the transition metal layer 14 are hybridized with the p orbitals of part of the silicon atoms in the substrate 16.

Positions of the transition metal atoms with respect to hexagon of the graphene layer 12 are varied as responding to different types of the transition metal. For example, Sc, Ti, V, Cr, Mn, Tc, Re and Fe reside directly below the center of the hexagon. Co is about half way away from the center of the hexagon, whereas Ni is on the edge directly below a C—C bond of the hexagon.

Compared to graphene/SiC composite structures in related art, the corrugation of graphene in the graphene-based composite structure 10 is significantly reduced to practically negligible for Sc, Ti, V, Cr, Mn, Tc, Re and Fe, and to only about 0.1 Å for Co and Ni.

The graphene-based composite structure 10 is a strongly bound system. A binding energy between the graphene layer 12 and composite structure of the transition metal layer 14 and the SiC substrate 16 is equal to or larger than 0.24 eV/C. Table 1 shows the binding energy between the graphene layer 12 and the composite structure of the transition metal layer 14 and the SiC substrate 16 with respect to different types of the transition metal. When the transition metal is Mn, Tc or Re, the binding energy is up to 0.51 eV/C, which is even larger than the binding energy of graphene on SiC substrate of 0.36 eV/C.

TABLE 1

| | Transition metal | | | | |
|---|---|---|---|---|---|
| Binding | Sc | Ti | V | Cr | Mn |
| energy (eV/C) | 0.24 | 0.36 | 0.40 | 0.43 | 0.51 |
| Binding | Tc | Re | Fe | Co | Ni |
| energy (eV/C) | 0.51 | 0.51 | 0.44 | 0.34 | 0.26 |

Figure 3:
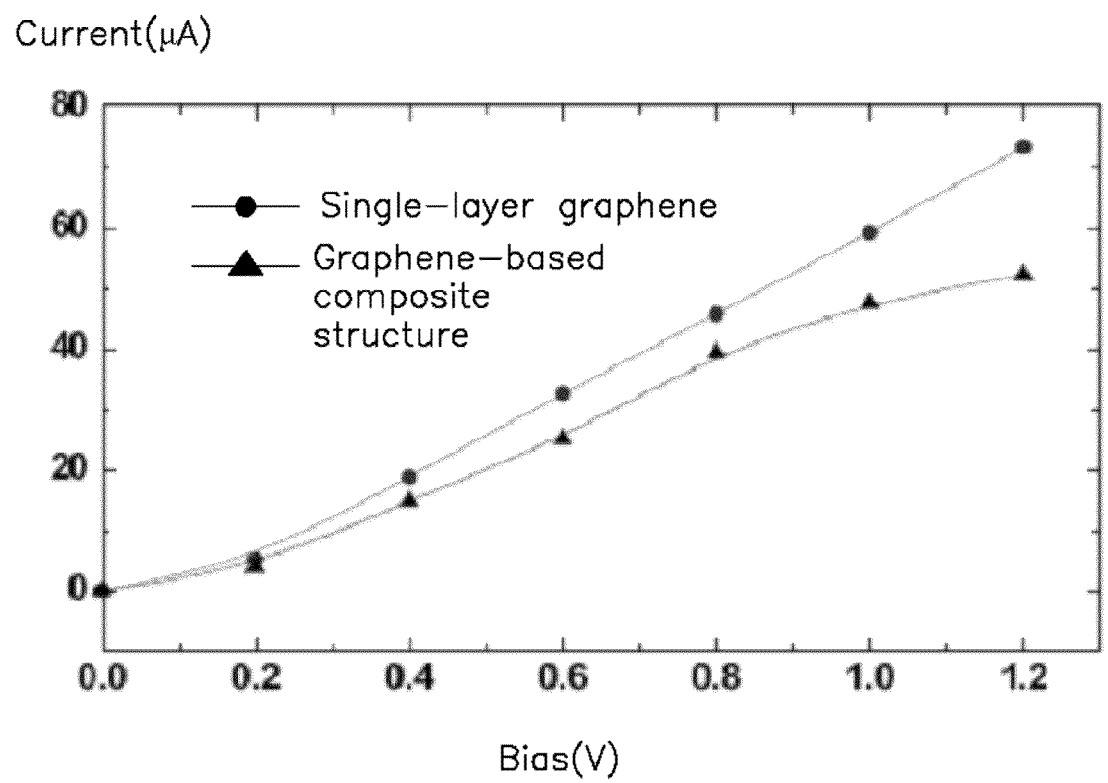
FIG. 3 is the I-V curves for the graphene-based composite structure according to one embodiment.

FIG. 3 shows a current-voltage (I-V) curve of the graphene-based composite structure 10. Evidently, the I-V characteristic of the graphene-based composite structure 10 is similar to characteristic of the free-standing single-layer graphene, especially under a moderate bias of less than about 0.8 V, which indicates that the graphene-based composite structure 10 has similar potential carrier mobility of the free-standing graphene.

Figure 4:
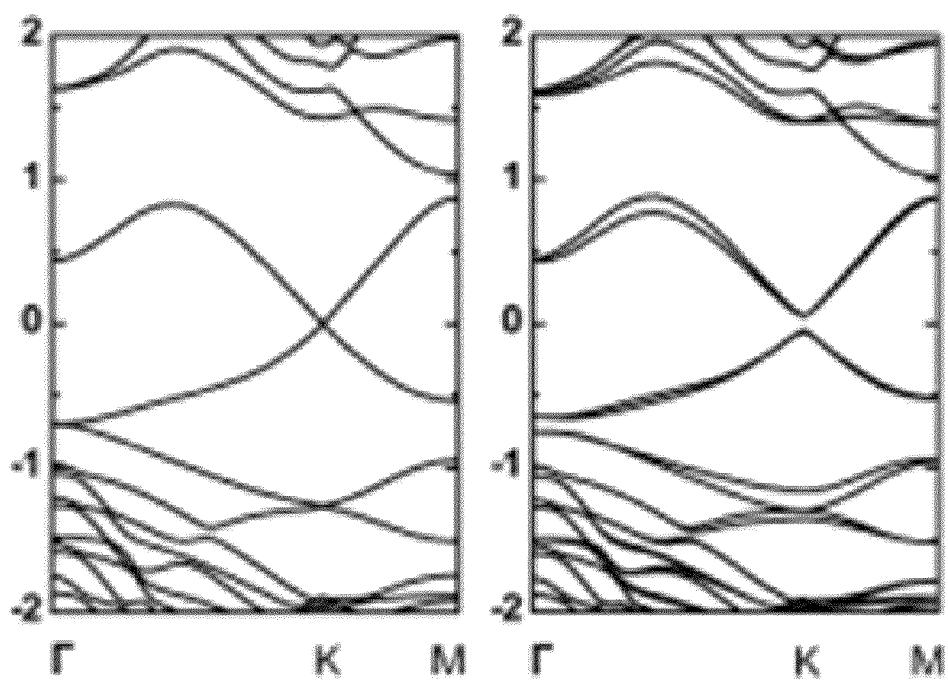
FIG. 4 is a schematic drawing of band structure of the graphene-based composite structure according to one embodiment.

FIG. 4 shows band structures of the graphene-based composite structure 10 without and with spin-orbit coupling (SOC). In detail, the substrate 16 is a SiC substrate, the transition metal is Re, and the graphene layer 12 is a monolayer graphene in the graphene-based composite structure 10 illustrated in FIG. 4. When the SOC is not considered (left panel), two bands cross each other at the Fermi level, forming a perfect Dirac cone, which is the same as that in Graphene/Mn/SiC and Graphene/Tc/SiC sandwich structures. When the SOC is considered (right panel), the Dirac cone splits and a gap of about 0.1 eV is opened at the Dirac point. The gap size is extremely large, nearly five orders of magnitude as that in the pristine graphene. The calculated results show that the Graphene/Re/SiC sandwich structure is a kind of topological insulator with an extremely large spin-orbit gap. For Mn and Tc, they have the nearly same valence electron configurations and binding energies as that of Re. Thus, the spin-orbit gap difference (about 30 meV for Mn and about 35 meV for Tc) arises from their distinct atomic SOC strength due to their distinct nuclear charge number.

Figure 5:
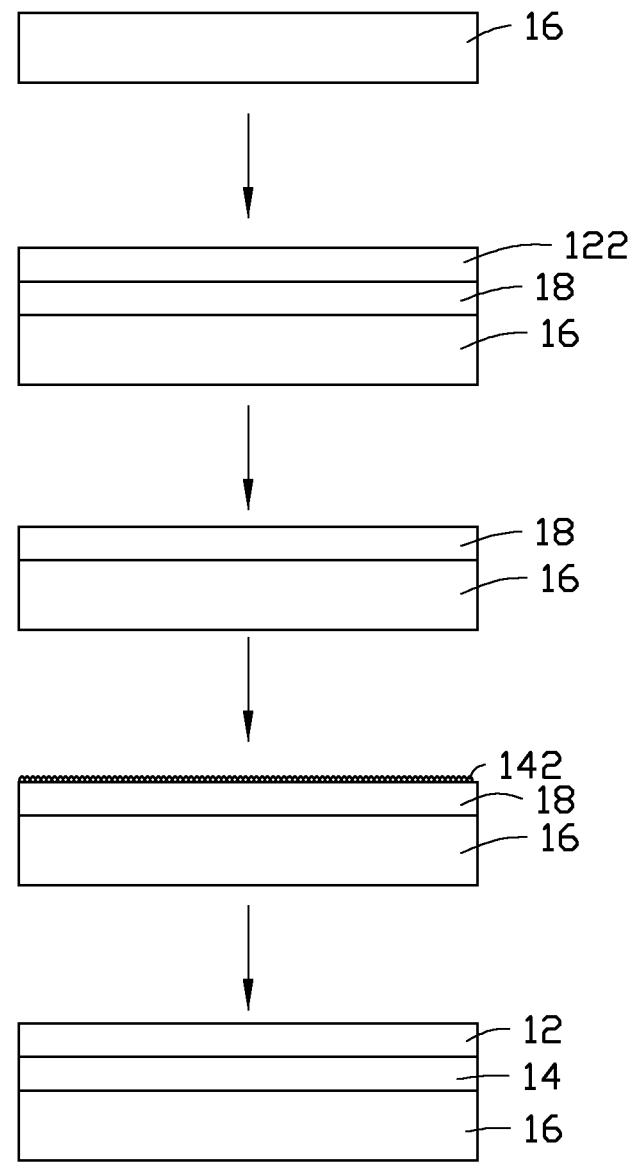
FIG. 5 is a flowchart of the method for making the graphene-based composite structure according to one embodiment.

Referring to FIG. 5, an embodiment of a method for making the graphene-based composite structure 10 includes steps of:

(S1) providing a substrate 16;

(S2) growing a buffer layer 18 and a first graphene layer 122 in series on surface of the substrate 16;

(S3) removing the first graphene layer 122;

(S4) depositing a transition metal atoms layer 142 onto surface of the buffer layer 18; and (S5) diffusing the transition metal atoms in the transition metal atoms layer 142 into gaps between the buffer layer 18 and the substrate 16 to form a transition metal layer 14 and recovering the buffer layer 18 to a graphene layer 12.

In step (S1), the substrate 16 can be a silicon carbide substrate. In one embodiment, the substrate 16 is an n-doped 6H—SiC(0001) substrate.

In step (S2), the growing the buffer layer 18 and the first graphene layer 122 is executed by annealing the substrate 16 to a temperature ranging from 1300° C. to 1500° C. for about 5 minutes to 10 minutes in a vacuum room. The pressure in the vacuum room is lower than $10^{-3}$ Pa. In one embodiment, the pressure in the vacuum room is lower than $10^{-4}$ Pa. The buffer layer 18 is practically a corrugated graphene layer.

In step (S3), the first graphene layer 122 can be removed by physical or chemical methods. In one embodiment, the first graphene layer 122 is removed by ultrasonic treatment.

In step (S4), the transition metal atoms layer 142 can be deposited onto the surface of the buffer layer 18 by molecular beam epitaxy, sputter, or evaporation process. In one embodiment, molecular beam epitaxy process is applied to deposit the transition metal atoms layer 142 with a deposition rate lower than 0.1 nm/min.

In step (S5), the diffusing the transition metal atoms into gaps between the buffer layer 18 and the substrate 16 is executed by annealing the substrate 16 to a temperature ranging from 400° C. to 800° C. for about 15 minutes to 45 minutes in the vacuum room. When the transition metal atoms diffuse into the gaps between the buffer layer 18 and the substrate 16, the transition metal atoms decouple the C—Si bonds between the buffer layer 18 and the substrate 16 and form d-p hybridization orbitals, with carbon atoms in the buffer layer 18 and silicon atoms in the substrate 16, respectively. After hybridization, the transition metal atoms form a stable layer structure between the buffer layer 18 and the substrate 16, which is called the transition metal layer 14. Meanwhile, the decoupling of C—Si bonds causes the corrugated buffer layer 18 occurring a structural recovery and transforming the buffer layer 18 to the graphene layer 12.

The graphene-based composite structure 10, provided in present disclosure, has excellent carrier mobility as well as high thermal and mechanical stabilities. The graphene-based composite structure 10 may be applied to various electronic devices and semiconductor devices, such as thin film transistor, integrated circuit, sensor, and other nano-scale devices.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A graphene-based composite structure comprising:
   a graphene layer;
   a transition metal layer; and
   a substrate;
   wherein the graphene layer, the transition metal layer, and the substrate are stacked together in series, the graphene layer and the transition metal layer are coupled by d-p orbitals hybridization, and the transition metal layer and the substrate are also coupled by d-p orbitals hybridization.

2. The graphene-based composite structure as claimed in claim 1, wherein the graphene layer and the transition metal layer are coupled by hybridization of d orbitals of transition metal atoms in the transition metal layer and p orbitals of carbon atoms in the graphene layer.

3. The graphene-based composite structure as claimed in claim 1, wherein the transition metal layer and the substrate are coupled by hybridization of d orbitals of transition metal atoms in the transition metal layer and p orbitals of silicon atoms in the substrate.

4. The graphene-based composite structure as claimed in claim 1, wherein the graphene layer is a single-layer graphene.

5. The graphene-based composite structure as claimed in claim 1, wherein the transition metal layer is a one-atom-thick transition metal layer.

6. The graphene-based composite structure as claimed in claim 1, wherein a transition metal in the transition metal layer is selected from the group consisting of Sc, Ti, V, Cr, Mn, Tc, Re, Fe, Co and Ni.

7. The graphene-based composite structure as claimed in claim 1, wherein the substrate is made of silicon carbide.

8. The graphene-based composite structure as claimed in claim 7, wherein a binding energy between the graphene layer and a composite structure of the transition metal layer and the substrate is equal to or larger than about 0.24 eV/C.

9. The graphene-based composite structure as claimed in claim 1, wherein a band structure of the graphene-based composite structure is a Dirac cone.

10. The graphene-based composite structure as claimed in claim 9, wherein the transition metal in the transition metal layer is selected from the group consisting of Mn, Tc, and Re.

11. The graphene-based composite structure as claimed in claim 10, wherein a binding energy between the graphene layer and a composite structure of the transition metal layer and the substrate is about 0.51 eV/C.

12. The graphene-based composite structure as claimed in claim 10, wherein a spin-orbit gap in the band structure is equal to or larger than 30 meV.

13. The graphene-based composite structure as claimed in claim 12, wherein the transition metal in the transition metal layer is Re and the spin-orbit gap in the band structure is about 100 meV.

14. The graphene-based composite structure as claimed in claim 13, wherein the graphene-based composite structure is a topological insulator.

15. A graphene-based composite structure comprising:
a graphene layer;
a transition metal layer; and
a substrate;
wherein the graphene layer, the transition metal layer, and the substrate are stacked together in series, the graphene layer and the transition metal layer are coupled by d-p orbitals hybridization, the transition metal layer and the substrate are also coupled by d-p orbitals hybridization, a transition metal in the transition metal layer is selected from the group consisting of Sc, Ti, V, Cr, Tc, Re, Fe, Co and Ni, and the transition metal layer is a one-atom-thick transition metal layer.

16. The graphene-based composite structure as claimed in claim 15, wherein a transition metal in the transition metal layer is selected from the group consisting of Sc, Ti, V, Cr, Tc, Re.

17. A graphene-based composite structure comprising:
a graphene layer;
a transition metal layer; and
a substrate;
wherein the graphene layer, the transition metal layer, and the substrate are stacked together in series, the graphene layer and the transition metal layer are coupled by d-p orbitals hybridization, and the transition metal layer and the substrate are also coupled by d-p orbitals hybridization, a material of the substrate is silicon carbide, a transition metal in the transition metal layer is selected from the group consisting of Sc, Ti, V, Cr, Mn, Tc, Re, Fe, Co and Ni, a binding energy between the graphene layer and a composite structure of the transition metal layer and the substrate is equal to or larger than about 0.24 eV/C.

18. The graphene-based composite structure as claimed in claim 17, wherein
when the transition metal is Sc, the binding energy is 0.24 eV/C;
when the transition metal is Ti, the binding energy is 0.36 eV/C;
when the transition metal is V, the binding energy is 0.40 eV/C;
when the transition metal is Cr, the binding energy is 0.43 eV/C;
when the transition metal is Mn, the binding energy is 0.51 eV/C;
when the transition metal is Tc, the binding energy is 0.51 eV/C;
when the transition metal is Re, the binding energy is 0.51 eV/C;
when the transition metal is Fe, the binding energy is 0.44 eV/C;
when the transition metal is Co, the binding energy is 0.34 eV/C; and
when the transition metal is Ni, the binding energy is 0.26 eV/C.

* * * * *